United States Patent [19]

Bender

[11] Patent Number: 4,757,025

[45] Date of Patent: Jul. 12, 1988

[54] METHOD OF MAKING GATE TURN OFF SWITCH WITH ANODE SHORT AND BURIED BASE

[75] Inventor: John R. Bender, Mesa, Ariz.

[73] Assignee: Motorola Inc., Schaumburg, Ill.

[21] Appl. No.: 936,919

[22] Filed: Nov. 28, 1986

Related U.S. Application Data

[63] Continuation of Ser. No. 715,715, Mar. 25, 1985, abandoned.

[51] Int. Cl.⁴ .................... H01L 21/38; H01L 21/441
[52] U.S. Cl. .......................................... 437/6; 357/38; 437/152
[58] Field of Search ................ 29/576 J, 576 E, 571; 148/1.5, 186, 188; 357/38

[56] References Cited

U.S. PATENT DOCUMENTS

| | | | |
|---|---|---|---|
| 4,032,953 | 6/1977 | Suzuki | 357/38 |
| 4,062,032 | 12/1977 | Neilson | 357/38 |
| 4,063,277 | 12/1977 | Gooen | 357/38 |
| 4,063,278 | 12/1977 | Huston | 357/38 |
| 4,127,863 | 11/1978 | Kurata | 357/38 |
| 4,137,545 | 1/1979 | Becke | 357/38 |
| 4,156,248 | 5/1979 | Neilson | 357/38 |
| 4,170,020 | 10/1979 | Sueoka et al. | 357/38 |
| 4,170,502 | 10/1979 | Watakabe | 148/191 |
| 4,213,067 | 7/1980 | Spellman et al. | 357/38 |
| 4,223,328 | 9/1980 | Terasawa et al. | 357/38 |
| 4,443,810 | 4/1984 | Yatsuo et al. | 357/38 |
| 4,450,467 | 5/1984 | Nagano | 357/84 |
| 4,511,913 | 4/1985 | Nagano | 357/38 |

OTHER PUBLICATIONS

Yang, "Fundamentals of Semiconductor Devices" McGraw-Hill, N.Y. pp. 25-26, 1978.

Primary Examiner—George T. Ozaki
Attorney, Agent, or Firm—Raymond J. Warren

[57] ABSTRACT

A GTO switch is provided in which the upper base layer (gate) is formed by a diffusion step. An epitaxial layer grown over the upper base layer contains cathode and gate diffusions which are separated by an undiffused gap. This "buried base" technique provides precise control over the resistivity of the base. The cathode-gate gap provides increased reverse gate voltage capacity. Other features include a large anode short area and a double-layer-metal; contact structure on the cathode-gate surface.

6 Claims, 6 Drawing Sheets

METHOD OF MAKING GATE TURN OFF SWITCH WITH ANODE SHORT AND BURIED BASE

This application is a division of application Ser. No. 715,715, filed Mar. 25, 1985, now abandoned.

FIELD OF THE INVENTION

The present invention relates, in general, to gate turn-off semiconductor switches. More particularly, the invention relates to an improved gate turn off switch design and a method for the manufacture of such devices.

BACKGROUND OF THE INVENTION

Gate turn-off (GTO) switches are widely known semiconductor devices capable of controlling a load current in response to a control signal. Such devices are often referred to as thyristors. Currently, it is desired to increase the capacity of such devices to handle greater currents and voltages. In doing so, however the turn off characteristics of the device must be maintained to as great a degree as possible. Typically, a GTO switch is a 4-layer vertical structure having a P-type (anode) layer on the bottom followed by N-type and P-type inner (base) layers and an N-type upper (cathode) layer. Recently, N-type shorts have been utilized extending up through the anode layer to the N-type base layer. The P-type base layer is brought to the upper surface of the device at some point to allow contact. This contact is commonly referred to as the gate. The upper two layers of the device have most commonly been manufactured by means of a double diffused process flow. That is, the P-type base is first defined by diffusion of a P-type dopant and then the N-type cathode is defined by the diffusion of an N-type dopant into the previously diffused P-type region.

In order to control the turn-off characteristics of a GTO switch it is necessary to carefully control the sheet resistance of the P-type base region. It has been found that this is relatively difficult to do using a double diffused process. This problem has become increasingly severe as the current and voltage capacities of the device are increased. A further requirement for GTO switches is the capacity to withstand a relatively high reverse gate voltage. The prior art double diffused method of forming the gate and cathode regions is not reliably capable of producing a reverse gate voltage capacity significantly in excess of 15 volts.

SUMMARY OF THE INVENTION

Accordingly, it is an object of the present invention to provide an improved GTO switch and method for the manufacture thereof.

A further object of the present invention is to provide a GTO switch having a precisely controlled base sheet resistance.

A further object of the present invention is provide an improved GTO switch having a relatively high reverse gate voltage capacity.

These and other objects and advantages of the present invention are provided by defining the sheet resistivity of the base region to a relatively low value by a diffusion step, growing a relatively lightly doped N-type epitaxial layer overlying the P-type base region and defining cathode and gate regions within the epitaxial layer by the diffusion of N-type and P-type dopants, respectively. The gate and cathode diffusions in the epitaxial layer are separated by a region which is left at the doping concentration of the epitaxial layer to provide an increased reverse gate voltage capacity. Other features of a preferred embodiment of the present invention include a unique layer with a relatively large anode short area and a two layer metallization pattern on the gate-cathode surface.

These and other objects and advantages of the present invention will be apparent to one skilled in the art from the detailed description below taken together with the drawings.

DETAILED DESCRIPTION OF A PREFERRED EMBODIMENT

FIGS. 1A-1D illustrate, in partial cross-sectional views, various intermediate steps in the manufacture of a GTO switch according to the principles of the present invention, As will be apparent from the description of the various mask steps below, a cross-section of the entire device would be unnecessarily confusing. Therefore, FIGS. 1A-1D illustrate only one "arm" of the involute spiral pattern which comprises the entire device.

Figure 1A:
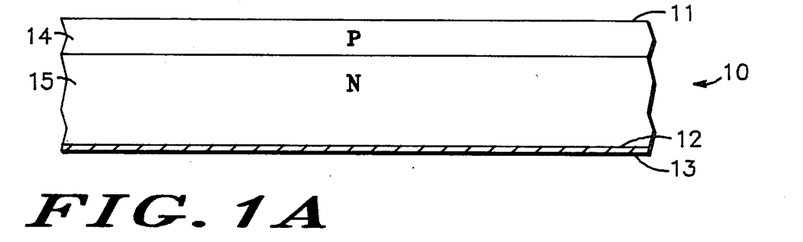
FIGS. 1A-1D are partial cross-sectional views of intermediate stages in the manufacture of a GTO switch according to the principles of the present invention.

FIG. 1A illustrates the results of the first several process steps. A single crystal silicon wafer 10 has a first major surface 11 and a second major surface 12. In the preferred embodiment of the invention described herein the starting wafer 10 is an N-type wafer having a resistivity in the range of 50-70 ohm centimeters and a thickness in the range of 12-13 mils. In the initial process steps an initial oxide layer 13 is grown on both first major surface 11 and second major surface 12 of wafer 10. Conventional photoresist and etch steps are used to remove initial oxide layer 13 from first major surface 11. Next, a P-type dopant such as boron is deposited on first major surface 11 and driven in to produce a P-type region 14 underlying first major surface 11 of wafer 10. The remainder 15 of wafer 10 remains N-type. P-type region 14 is preferably in the range of 30-50 microns thick and has a sheet resistance in the range of 40-100 ohms per square. It has been found that best results are achieved with a sheet resistance in the range of 40-60 ohms per square.

The process steps described above defines the resistivities of what will eventually become the N-type base region (region 15) and the P-type base region (region 14) of the finished GTO switch. In this manner, it is possible to control very accurately the resistivity of the P-type base region 14.

Figure 1B:
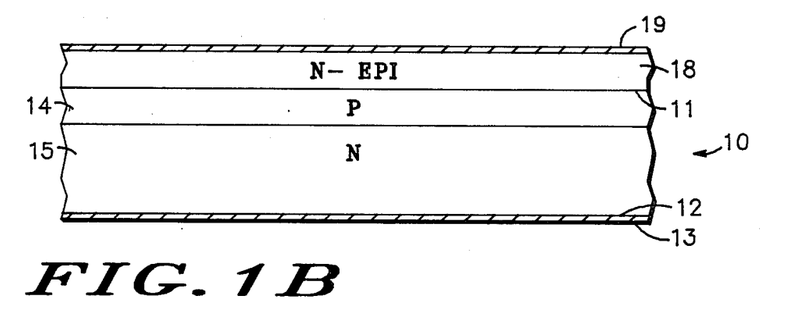

FIG. 1B illustrates the result of the next several process steps. First, several standard cleaning steps are applied to first major surface 11 of wafer 10 to remove the result of the P-type dopant deposition and drive in. Next, an N$^-$ epitaxial layer 18 is grown overlaying first major surface 11 of wafer 10. Epitaxial layer 18 preferably has a resistivity in the range of 50-200 ohm centimeters and a thickness in the range 20-40 microns. Epitaxial layer 18 may be grown by any of a number of conventional processes, such as liquid phase epitaxy (LPE). Finally, an oxide layer 19 is grown overlaying epitaxial layer 18. Oxide layer 19 will serve as diffusion mask for the various diffusions to be placed in epitaxial layer 18.

Figure 1C:
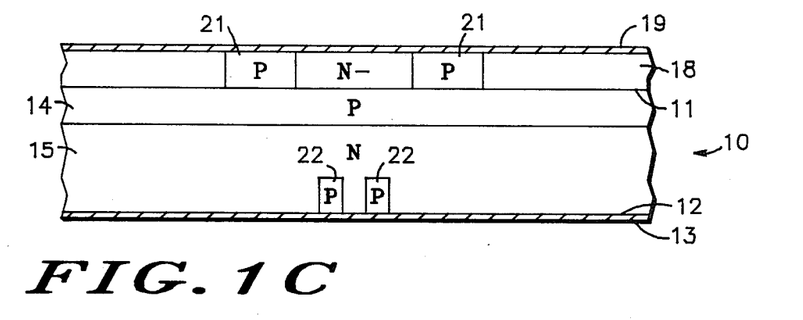

FIG. 1C illustrates the result of the next several process steps. The purpose of these process steps is to define the P-type diffusions in epitaxial layer 18 and N-type base region 15 which will eventually form the gate and anode, respectively, of the finished GTO switch. Using conventional photoresist and oxide etching steps, appropriate openings are made in oxide layer 19 and oxide layer 13. The details of the masks used to produce these openings will be discussed below. The openings in oxide layers 19 and 13 are not shown in FIG. 1C since the succeeding process steps regrow the oxide layers in those regions. Once the appropriate openings in oxide layers 19 and 13 are produced a P-type dopant, such as boron, is deposited over the surfaces and is driven into epitaxial layer 18 and to N-type region 15, respectively. This produces a pair of spaced apart P-type regions 21 in epitaxial layer 18 and a pair of spaced apart P-type regions 22 in N-type region 15. As will be discussed in detail below, P-type regions 22 directly underlie the portion of epitaxial layer 18 between P-type regions 21. As will be apparent, the resistivity and thickness of P-type regions 21 and 22 will be substantially identical, since they are produced simultaneously. It is important that P-type regions 21 be diffused sufficiently deeply so that they extend entirely through epitaxial layer 18 to reach P-type base region 14. The sheet resistance of P-type regions 21 and 22 may advantageously be in the range of 20-30 ohms per square. By means of the process steps just described, contact to P-type base region 14 is made available at the surface of epitaxial layer 18, which will form the upper active surface of the device. Thus, P-type regions 21 form the gate of the device. Simultaneously, the anode of the device has been formed by P-type diffusions 22.

Figure 1D:
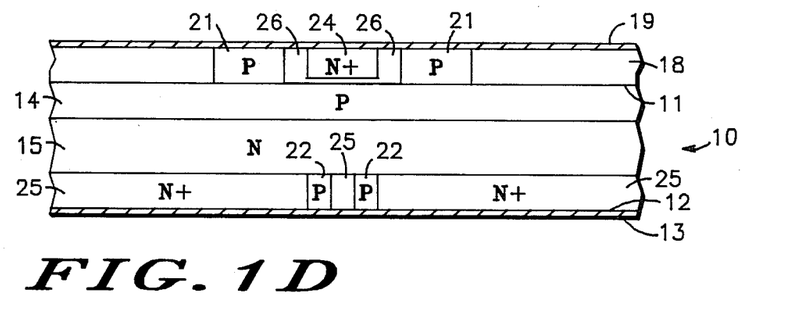

FIG. 1D illustrates the results of the next several steps in the process. After these steps are complete, the basic GTO switch is finished but for the steps of separating each die from the overall wafer and defining the various contacts and passivations. The next several process steps involve the definition of N$^+$ diffusions in epitaxial layer 18 and N-type region 15. To this end, conventional photoresist and oxide etch steps are used to produce appropriate openings in oxide layers 19 and 13, respectively. Again, the details of the masks used will discussed below. Next, an N-type dopant, such as phosphorus, is deposited over the surfaces and driven in to the exposed semiconductor material. This produces an N$^+$ cathode region 24 in epitaxial layer 18 and an N$^+$ anode short region 25 in N-type region 15. N$^+$ regions 24 and 25 may advantageously have a sheet resistivity in the range of 0.5 to 2.0 ohms per square. Once again, regions 24 and 25 are produced simultaneously and will therefore have approximately identical characteristics. It is important that the thickness of N$^+$ region 24 be approximately 5 microns less than that of epitaxial layer 18 so that an N$^-$ region separates it from P-type base region 14.

N$^+$ cathode region 24 is placed in epitaxial layer 18 between P-type gate regions 21. The masks used are such that a gap 26 is left between the outer edges of cathode 24 and the inner edges of gates 21. Gap 26 may advantageously be approximately 1.25 mils wide. A range of 0.5-2 mils is believed to be acceptable. Gap 26 remains relatively lightly doped and serves to allow the gate/cathode reverse blocking field to spread. This serves to increase the reverse gate voltage capacity of the GTO switch.

N$^+$ anode short 25 is relatively large compared to P-type anode region 22. In addition, anode short region 25 fills the gap between the relatively closely spaced P-type anode regions 22. This feature is found to be optional.

FIG. 1D illustrates many features of the GTO switch according to the principles of the present invention. P-type base region 14 is a "buried" region. This provides for more accurate control over the resistivity of base region 14 than was provided by prior art double diffused processes. The low base sheet resistivity chosen provides excellent turn-off characteristics for the finished device. Further, the two-step diffusion process used to define cathode 24 and gate 21 is readily adaptable to produce a very lightly doped gap 26 between these regions. This provides a greater reverse gate voltage capacity than was provided with prior art devices.

The remainder of the detailed description and the drawings are devoted to a description of the mask steps used in the process of making a GTO switch according to the principles of the present invention. Due to the relatively complex pattern of the masks, cross sectional views illustrating these masks would be unduly complicated. The basic pattern of the masks, which may be referred to as an involute spiral is discussed in some detail in U.S. Pat. No. 4,529,999 issued on July 16, 1985 and assigned to the assignee of the present invention.

Figure 2A:
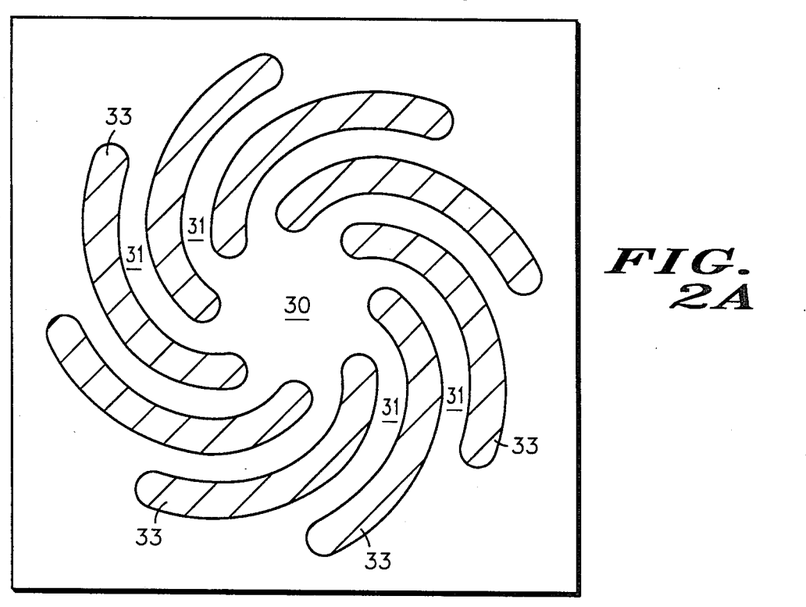
FIGS. 2A-2B are plan views of diffusion patterns used in defining the gate and anode regions, respectively, in the manufacture of a GTO switch according to the principles of the present invention.
Figure 2B:
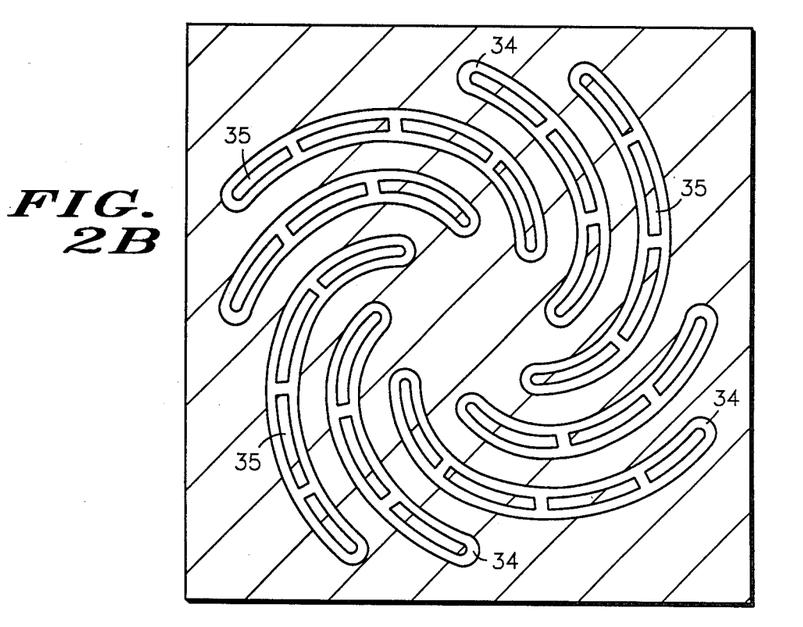

FIGS. 2A and 2B illustrate the masks used to open the oxide layers prior to the forming of P-type diffusions 21 and 22, respectively of FIG. 1C. As will be the convention used throughout, FIGS. 2A and 2B are shaded to indicate those areas in which oxide or other material remains after the patterning steps. Therefore, the P-type dopant is deposited in the unshaded regions of FIGS. 2A and 2B.

Figure 4:
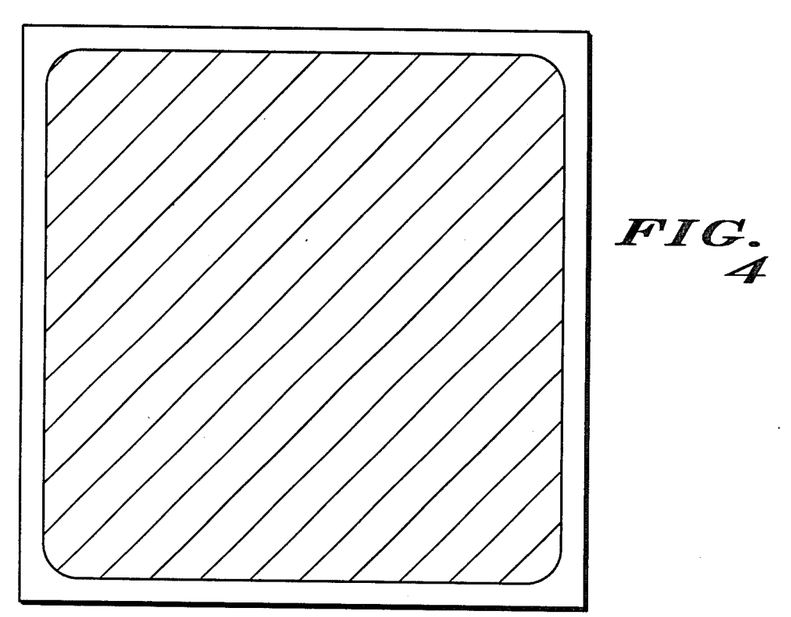
FIG. 4 is a plan view of a mask used to perform a moat etch in the manufacture of a GTO switch according to the principles of the present invention.

In plan view, a GTO device according to the preferred embodiment occupies a square area approximately 210 mils on a side. FIG. 2A illustrates the gate pattern of the device. The gate (the unshaded region) comprises a central roughly circular region 30 from which a plurality of arms 31 extend in an involute spiral pattern. The outer edges 32 of the device also form a part of the gate. In the preferred embodiment of the invention, central region 30 is approximately roughly 50 mils in diameter. Arms 31 are approximately 9 mils wide. Arms 33, which separate arms 31 and will eventually form the cathode and gate-cathode gaps, are approximately 13 mils wide. Arms 33 are laid out to substantially fill a square region approximately 190 mils on a side centered of the die. The remainder of the upper surface of the die will be removed by the moat etch (FIG. 4). FIG. 2B illustrates the mask used to define anode diffusion 22 of FIG. 1C. It should be noted that the sense of rotation of the involute spiral pattern of FIG. 2B is reversed from that of FIG. 2A. Thus, when mask 2B is used on the reverse side of the wafer from the mask of FIG. 1A, the respective spiral patterns will coincide. The unshaded portions of the mask of FIG. 2B comprises a plurality of arms 34. In the preferred embodiment of the invention, arms 34 are approximately 12 mils wide. Each arm 34 is broken up by regions 35 in which the P-type dopant is prevented from being deposited on the semiconductor surface. This corresponds to the relatively small gap between P-type regions 22 in FIG. 1C. In the preferred embodiment of the present invention regions 35 run down the center of arms 34 and are approximately 4 mils wide. However, it has been found that the characteristics of the device are not significantly altered if regions 35 are not included, that is, if arms 34 are solid. As noted above with respect to FIG. 1C, arms 34 are arranged to lie directly beneath arms 33 in the pattern of FIG. 2A. This provides that the anode of the finished device directly underlies its cathode.

Figure 3A:
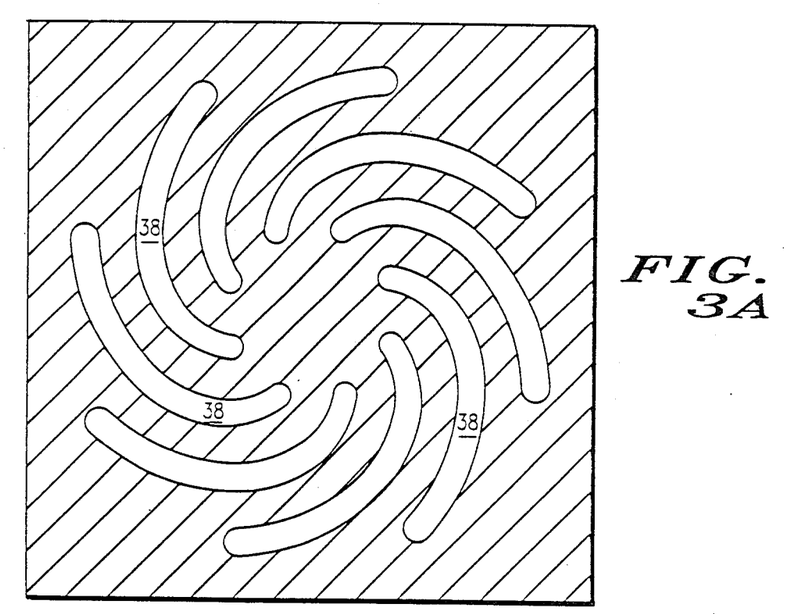
FIGS. 3A-3B are plan views of diffusion patterns used in defining the cathode and anode short regions, respectively, in the manufacture of a GTO switch according to the principles of the present invention.
Figure 3B:
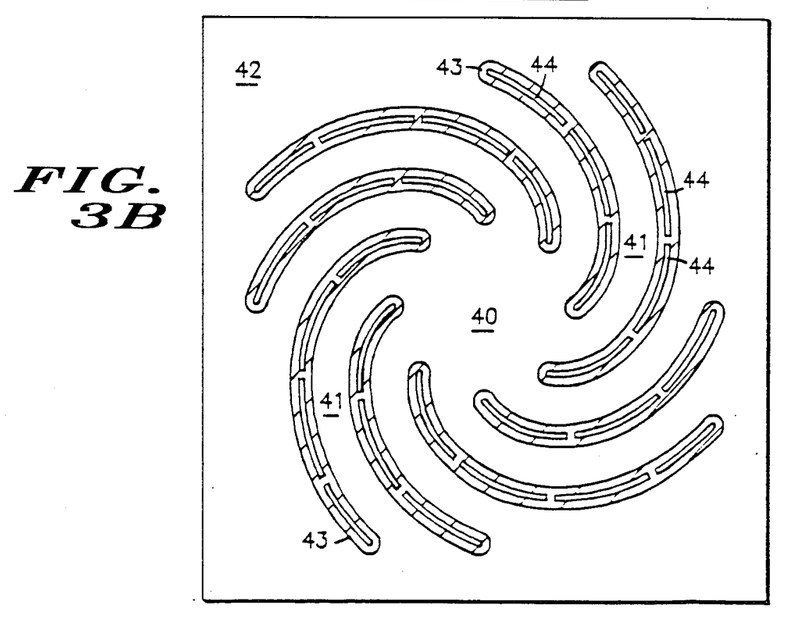

Referring now to FIGS. 3A and 3B, the masks used to produce the cathode 24 and anode short 25 diffusions of FIG. 1D are described. The cathode pattern, which comprises the unshaded portions of FIG. 3A, consists of a plurality of arms 38. Arms 38 are arranged to coincide with arms 33 of FIG. 2A. In the preferred embodiment, arms 38 are approximately 8 mils wide. This correspondence between arms 33 of FIG. 2A and arm 38 of FIG. 3A and the fact that arms 38 are narrower than arms 33 provide the cathode-gate relationship illustrated in cross-section in FIG. 1D. That is, each N+ cathode arm (arms 38) lies between and is spaced from two P-type gate arms (arms 31).

The N+ anode short pattern, which corresponds to the unshaded portions of FIG. 3B, comprises the entire lower surface of the device but for the anode. The anode short region comprises a roughly circular central area 40, a plurality of involute spiral arms 41 extending from central area 40 and the entire outer edges 42 of the device. Arms 43, which define the areas in which oxide is left to protect the prior anode diffusion, are identical but for size with arms 34 of FIG. 2B. Arms 43 are approximately 8 mils wide. Gaps 44 in arms 43, which correspond to areas 35 in FIG. 2B, are approximately 2 mils wide. Of course, if solid anode arms are used, arms 43 will similarly be solid.

Referring now to FIG. 4, a mask is described which is used to etch the moat which surrounds each GTO switch. This moat is a well known device which serves to separate each device on the wafer. The moat typically extends from the upper surface of the device down to a point at which the N-type base region (region 15 of FIG. 1D) is exposed. The unshaded portion of FIG. 4 sets out the area in which the etchant is allowed to attack the semiconductor material and define the moat.

The shaded central portion of the corresponds to the upper active surface of the finished device. Of course, the back side (the anode side) of the wafer is completely protected from the moat etch process.

Figure 5:
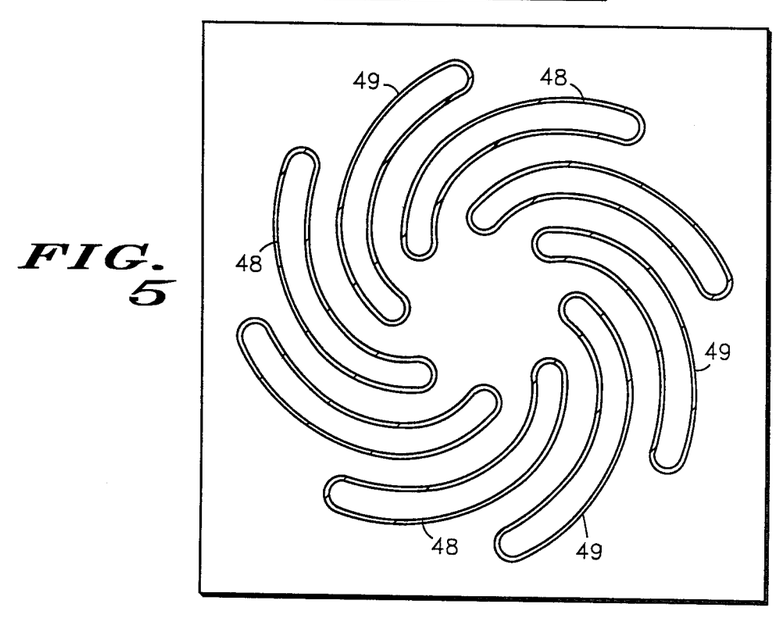
FIG. 5 is plan view of a mask used to perform a passivation oxide etch in the manufacture of a GTO switch according to the principles of the present invention.

Referring now to FIG. 5, the mask used to pattern an isolation oxide layer is described. The isolation oxide layer to be patterned with the mask of FIG. 5. lies on the gate-cathode surface of the device. The goal is to place a band of isolation oxide on this surface around each of the cathode arms to provide isolation between the gate metallization and the cathode metallization. The shaded portion of the mask of FIG. 5 corresponds to those areas in which the oxide is left on the surface of the device after the patterning step. The mask of FIG. 5 comprises a plurality of inner arms 48 which correspond precisely in size and location to arms 38 of FIG. 3A and a plurality of outer arms 49. Each outer arm 49 surrounds an inner arm 48. Outer arms 49 are approximately 14 mils wide. It is the space between each inner arm 48 and its corresponding outer arm 49 in which the isolation oxide is undisturbed by the patterning process. Once again the anode side of the wafer is not altered in this process step.

Figure 6:
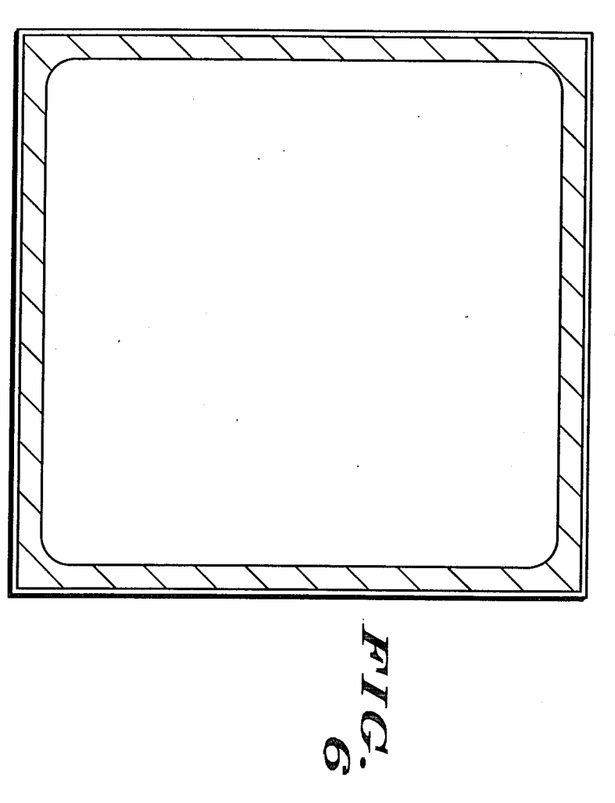
FIG. 6 is a plan view of a mask used to pattern a passivation photoglass layer in the manufacture of a GTO switch according to the principles of the present invention.

Referring now to FIG. 6 a mask which is used to pattern a photoglass isolation layer is described. The mask of FIG. 6 is used to pattern a layer of photoglass which is used to passivate the edges of the various semiconductor layers which are exposed by the moat etch described above with regard to FIG. 4. The shaded area of the mask of FIG. 6 correspond to those areas of the photoglass layer which are undisturbed by the patterning process. As is apparent from a comparison of FIGS. 4 and 6, the photoglass layer is merely allowed to remain around the exposed edges of the device. This passivation technique is widely used in making GTO devices.

Figure 7:
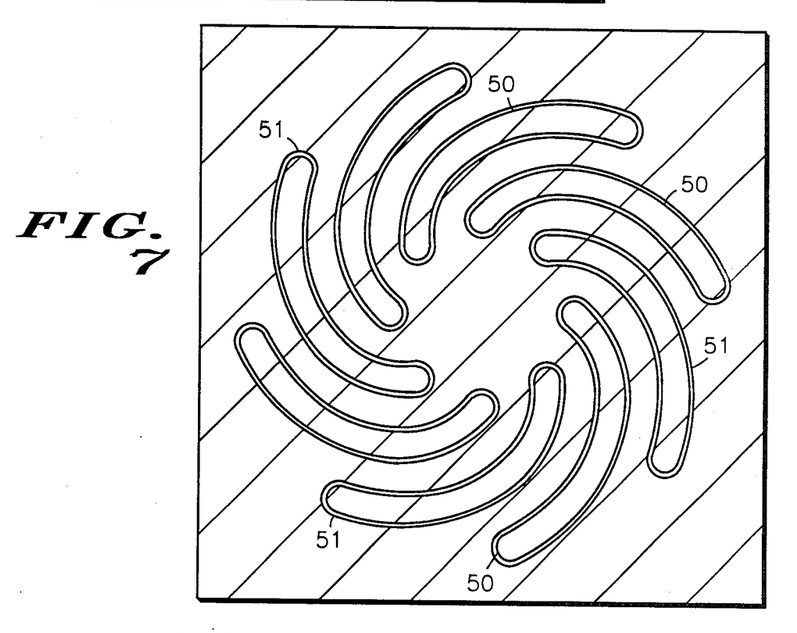
FIG. 7 is plan view of a mask used to pattern a first metal layer in the manufacture GTO switch according to the principles of the present invention.

The next step in the process used in the preferred embodiment of the present invention does not involve the use of a mask. This step in the process involves the gold doping of the device. Gold doping is a widely used process which acts to decrease the lifetime of mobile carriers in the semiconductor material so doped. It is widely known that gold doping may improve the performance of a GTO device. In the preferred embodiment of the present invention the gold doping takes place immediately after the passivation glass around the edges of the device has been patterned and fired. The gold is deposited by immersion plating over both surfaces of the wafer and diffused at a temperature of 875° C. for a period of 1 hour. Of course, it may be desirable in some circumstances to eliminate the gold doping step. In addition, diffusion temperatures in the range of 750° C. to 900° C. may be appropriate. The next step in the process after gold doping is illustrated with respect to the mask of FIG. 7. The mask of FIG. 7 is used to pattern the first of two metal layers used to make contact to the gate and cathode on the top of the device. This first metallization layer is also applied to the bottom surface of the device, but it not patterned there. A single metal layer on the bottom surface makes contact to both the anode and the anode short.

In the preferred embodiment of the present invention the first metallization layer is aluminum which is deposited over the surface of the wafer and patterned on the top surface by means of the mask of FIG. 7. The shaded portions of FIG. 7 correspond to the portions of the aluminum layer remaining after the patterning step. The mask of FIG. 7 is identical to the mask of FIG. 5 but for the fact that one may be considered the negative of the other. Mask 7 comprises a plurality of inner arms 50 which have a width of approximately 8 mils and overlie the cathode diffusions and a plurality of outer arms 51 which have a width of approximately 14 mils and surround inner arms 50. The aluminum layer is left on the surface of the device everywhere except between each inner arm 50 and its corresponding outer arm 51 (thus corresponding to the area of the isolation oxide patterned with the mask of FIG. 5) and around the edges of the device overlying the passivation photoglass.

Figure 8:
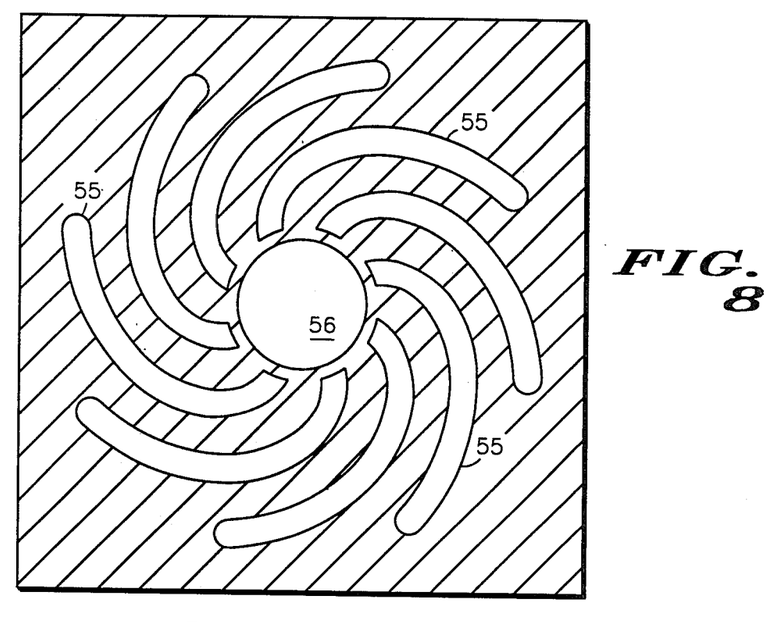
FIG. 8. is a plan view of a mask used to pattern a polyimide inter-layer dielectric in the manufacture of a GTO switch according to the principles of the present invention.

The next step in the process according to the preferred embodiment of the present invention comprises the deposition and patterning of a layer of polyimide overlaying the first metal layer. The polyimide is deposited by conventional means and patterned with the mask of FIG. 8. The shaded portions of the mask of FIG. 8 correspond to those areas in which the polyimide layer is unaffected by the patterning process. The unshaded portions of FIG. 8 correspond to openings in the polyimide layer through which contact may be made to the first metal layer. These openings comprise a plurality of arms 55 which have a width of approximately 8 mils and are arranged to overlie arms 50 of FIG. 7 and a central circular area 56 which has a diameter of approximately 50 mils and overlie the central gate region 30 of FIG. 2A. Thus, the opening in the polyimide layer corresponding to central region 56 provides contact to the gate of the device and the openings corresponding to arms 55 allow contact to the cathode of the device. It should be noted that the inner end of each arm 55 is separated from the outer edge of central region 56 by a distance of approximately 3 mils.

Figure 9:
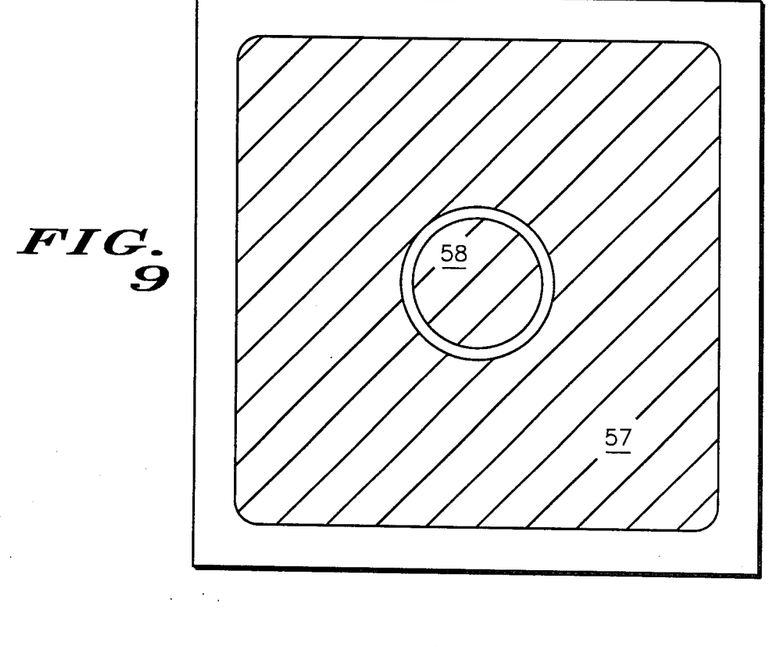
FIG. 9 is a plan view of a mask used to pattern a second metal layer in the manufacture of a GTO switch according to the principles of the present invention.

The final step in the process according to the preferred embodiment of the present invention comprises the deposition and patterning of a second metal layer. The mask used to perform this patterning is illustrated in FIG. 9. The shaded portions of FIG. 9 correspond to those areas of the second metal layer which are unaffected by the patterning process. In the preferred embodiment of the present invention the second metal layer comprises a layer of Ti-Ni-Ag which is first evaporated over the entire surface of the device and then patterned with the mask of FIG. 9. As will be apparent from FIG. 9 two contact areas are thus defined by the second metal layer. A first contact area 57 overlies the majority of the device and provides contact through the polyimide layer to those portions of the first metal layer which overlie the cathode arms of the device. Second contact region 58 comprises a disk approximately 50 mils in diameter located in the center of the device and isolated from the first contact region by a gap of approximately 3 mils. Second contact 58 provides contact through the polyimide layer to the portion of the first metal layer overlaying the central region of the gate of the device. Thus are provided the necessary gate and cathode connections to the device. The Ti-Ni-Ag is also deposited over the Al layer on the back (anode) surface of the device, although no patterning takes place on the back side. The purpose is to enhance solderability to the anode surface.

With reference to FIGS. 2A and 2B above, it should be noted that the width of arms 38 (the cathode diffusion) should be made as small as possible in order to increase the turn-off performance of the device. A range of 4–16 mils may be appropriate for the particular device disclosed hereinabove. As will be apparent, up to this point an improved GTO switch and a method for the manufacture thereof have been disclosed. The method provides a ready means for precisely determining the base sheet resistance of such a GTO switch. In addition, a GTO switch having a relatively high reverse gate voltage capacity is provided.

I claim:

1. A method of manufacturing a gate-controlled switch comprising the steps of:

providing a body of semiconductor material of a second conductivity type, said body having a first major surface and a second major surface opposite said first major surface;

forming a base layer of semiconductor material of a first conductivity type at said first major surface of said body;

growing a layer of epitaxial semiconductor material of said second conductivity type overlaying said first major surface of said body;

forming a gate region of said first conductivity type in said layer of epitaxial material, said gate region being contiguous with said base layer;

forming an anode region of said first conductivity type in said body, said anode region being contiguous with said second major surface of said body;

forming a cathode region of said second conductivity type in said layer of epitaxial material, said cathode region being separated from said gate region; and forming an anode shorting region of said second conductivity type in said body, said anode shorting region being contiguous with said second major surface of said body and disposed about a portion of said anode region.

2. A method according to claim 1 wherein said step of growing a layer of epitaxial semiconductor material further comprises the step of:

introducing a dopant of said second conductivity type in a concentration sufficient to produce a resistivity in the range of 50 to 200 ohm centimeters in said layer.

3. A method according to claim 1 wherein:

said base layer has a sheet resistivity in the range of 40 to 100 ohms per square.

4. The method of claim 1 wherein said anode region is juxtaposed to said cathode region.

5. A method of manufacturing a gate-controlled switch comprising the steps of:

providing a body of semiconductor material of a second conductivity type, said body having a first major surface and a second major surface opposite said first major surface;

forming a base layer of semiconductor material of a first conductivity type at said first major surface of said body;

growing a layer of epitaxial semiconductor material of said second conductivity type overlaying said first major surface of said body;

forming a first and second gate regions of said first conductivity type in said layer of epitaxial material, said first and second gate regions being contiguous with said base layer;

forming an anode region of said first conductivity type in said body, said anode region being contiguous with said second major surface of said body;

forming a cathode region of said second conductivity type in said layer of epitaxial material between said first and second gate regions, said cathode region being separated from said first and second gate regions and being juxtaposed to said anode region; and forming an anode shorting region of said second conductivity type in said body, said anode shorting region being contiguous with said second major surface of said body and disposed about a portion of said anode region.

6. A method of manufacturing a gate-controlled switch comprising the steps of:

providing a body of semiconductor material of a second conductivity type, said body having a first major surface and a second major surface opposite said first major surface;

forming a base layer of semiconductor material of a first conductivity type at said first major surface of said body;

growing a layer of epitaxial semiconductor material of said second conductivity type overlaying said first major surface of said body;

forming a gate region and an anode region of said first conductivity type, said gate region being formed in said layer of epitaxial material and being contiguous with said base layer, said anode region being formed in said body and being contiguous with said second major surface of said body;

forming a cathode region of said second conductivity type in said layer of epitaxial material, said cathode region being separated from said gate region and being juxtaposed to said anode region; and forming an anode shorting region of said second conductivity type in said body, said anode shorting region being contiguous with said second major surface of said body and disposed about a portion of said anode region.

* * * * *